United States Patent
Ichien

(10) Patent No.: US 9,698,824 B2
(45) Date of Patent: Jul. 4, 2017

(54) DATA TRANSFER DEVICE, DATA TRANSFER SYSTEM, METHOD FOR COMPRESSING AND TRANSFERRING DATA, AND PROGRAM

(71) Applicant: NEC Corporation, Minato-ku, Tokyo (JP)

(72) Inventor: Masumi Ichien, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/782,022

(22) PCT Filed: Mar. 28, 2014

(86) PCT No.: PCT/JP2014/059148
§ 371 (c)(1),
(2) Date: Oct. 2, 2015

(87) PCT Pub. No.: WO2014/168025
PCT Pub. Date: Oct. 16, 2014

(65) Prior Publication Data
US 2016/0065241 A1    Mar. 3, 2016

(30) Foreign Application Priority Data
Apr. 12, 2013 (JP) ................. 2013-083786

(51) Int. Cl.
*G06F 3/06* (2006.01)
*H03M 7/30* (2006.01)
(Continued)

(52) U.S. Cl.
CPC .......... *H03M 7/6023* (2013.01); *G06F 3/067* (2013.01); *G06F 3/0613* (2013.01); *G06F 3/0653* (2013.01); *H04L 69/04* (2013.01)

(58) Field of Classification Search
None
See application file for complete search history.

(56) References Cited

U.S. PATENT DOCUMENTS

| 6,289,130 B1 | 9/2001 | Cooklev |
| 2007/0109153 A1 | 5/2007 | Ma et al. |

(Continued)

FOREIGN PATENT DOCUMENTS

| JP | H01-108631 A | 4/1989 |
| JP | H05-145437 A | 6/1993 |

(Continued)

OTHER PUBLICATIONS

C. Pu and L Singaravelu, "Fine-grain adaptive compression in dynamically variable networks", in International Conference on Distributed Computing Systems, 2005, pp. 685-694.

(Continued)

*Primary Examiner* — Scott Sun

(57) ABSTRACT

A data transfer device includes a calculation unit and a compression processing unit. The calculation unit determines, from a plurality of compression techniques, a combination of a first compression technique and a second compression technique for optimizing effective throughput based at least on compression performance parameters related to the plurality of compression techniques and a transfer performance parameter related to transfer processing, the first compression technique being a technique in which a speed of compression processing serves as a constraint in a data transfer as compared with a speed of transfer processing, the second compression technique being a technique in which a speed of transfer processing serves as a constraint in a data transfer as compared with a speed of compression processing. The compression processing unit compresses target data using at least one of the first compression technique and the second compression technique.

15 Claims, 8 Drawing Sheets

(51) Int. Cl.
*H04L 29/06* (2006.01)
*G06F 13/38* (2006.01)

(56) References Cited

U.S. PATENT DOCUMENTS

2009/0300167 A1* 12/2009 Jones ................ G06F 15/16
709/224
2011/0208833 A1* 8/2011 Fallon ................ H04N 9/8042
709/217

FOREIGN PATENT DOCUMENTS

| | | |
|---|---|---|
| JP | H07-162460 A | 6/1995 |
| JP | H08-147251 A | 6/1996 |
| JP | 3329390 B2 | 9/2002 |
| JP | 2008-160535 A | 7/2008 |
| JP | 2010-141515 A | 6/2010 |
| WO | 2006/054618 A1 | 5/2006 |
| WO | 2008/126274 A1 | 10/2008 |

OTHER PUBLICATIONS

International Search Report for PCT Application No. PCT/JP2014/059148, mailed on Jun. 10, 2014.

* cited by examiner

| ALGORITHM IDENTIFICATION NUMBER i | 1 | 2 | 3 |
|---|---|---|---|
| COMPRESSION PROCESSING SPEED $C_i$ (MB/S) | 108.89 | 17.88 | 512950 |
| COMPRESSION RATIO $R_i$ | 0.68 | 0.38 | 1 |
| Data ratio $X_i$ | 0.22 | 0.77 | 0 |
| $PC_iR_i$ | 370.22 | 33.972 | - |

DATA TRANSFER DEVICE, DATA TRANSFER SYSTEM, METHOD FOR COMPRESSING AND TRANSFERRING DATA, AND PROGRAM

This application is a National Stage Entry of PCT/JP2014/059148 filed on Mar. 28, 2014, which claims priority from Japanese Patent Application 2013-083786 filed on Apr. 12, 2013, the contents of all of which are incorporated herein by reference, in their entirety.

TECHNICAL FIELD

The present invention relates to a data transfer device, a data transfer system, a method for compressing and transferring data, and a program.

BACKGROUND ART

In a parallel computer including a plurality of processors connected via a network, there is a system for compressing transfer data between the processors (for example, see Patent Document 1).

As disclosed in Patent Document 1, it is possible to consequently improve effective throughput because an actual transfer data amount is reduced by transferring compressed data.

PRIOR ART DOCUMENTS

Patent Document

[Patent Document 1]
Japanese Unexamined Patent Application, First Publication No. H08-147251

SUMMARY OF THE INVENTION

Problem to be Solved by the Invention

It is possible to further improve the effective throughput by compressing transfer data. That is, it is possible to further reduce the actual transfer data amount by increasing a compression ratio. However, when the compression ratio is high, the compression processing does not catch up with transfer processing. Thus, there is a problem in that waste occurs in a network band.

The present invention has been made in view of the above-described circumstances. An exemplary object of the present invention is to provide a data transfer device, a data transfer system, a method for compressing and transferring data, and a program capable of solving the above-described problem.

Means for Solving the Problem

A data transfer device according to a first exemplary aspect of the present invention includes: a calculation unit that determines, from a plurality of compression techniques, a combination of a first compression technique and a second compression technique for optimizing effective throughput based at least on compression performance parameters related to the plurality of compression techniques and a transfer performance parameter related to transfer processing, the first compression technique being a technique in which a speed of compression processing serves as a constraint in a data transfer as compared with a speed of transfer processing, the second compression technique being a technique in which a speed of transfer processing serves as a constraint in a data transfer as compared with a speed of compression processing; and a compression processing unit that compresses target data using at least one of the first compression technique and the second compression technique.

A data transfer system according to a second exemplary aspect of the present invention includes: the above-described data transfer device; and an external device that is connected to the data transfer device via a network, and receives the target data from the data transfer device.

A method for compressing and transferring data according to a third exemplary aspect of the present invention includes: determining, from a plurality of compression techniques, a combination of a first compression technique and a second compression technique for optimizing effective throughput based at least on compression performance parameters related to the plurality of compression techniques and a transfer performance parameter related to transfer processing, the first compression technique being a technique in which a speed of compression processing serves as a constraint in a data transfer as compared with a speed of transfer processing, the second compression technique being a technique in which a speed of transfer processing serves as a constraint in a data transfer as compared with a speed of compression processing; and compressing target data using at least one of the first compression technique and the second compression technique.

A program according to a fourth exemplary aspect of the present invention causes a computer to execute: determining, from a plurality of compression techniques, a combination of a first compression technique and a second compression technique for optimizing effective throughput based at least on compression performance parameters related to the plurality of compression techniques and a transfer performance parameter related to transfer processing, the first compression technique being a technique in which a speed of compression processing serves as a constraint in a data transfer as compared with a speed of transfer processing, the second compression technique being a technique in which a speed of transfer processing serves as a constraint in a data transfer as compared with a speed of compression processing; and compressing target data using at least one of the first compression technique and the second compression technique.

Effect of the Invention

According to the present invention, it is possible to simply execute processing in which a network (NW) bandwidth is effectively used.

EMBODIMENTS FOR CARRYING OUT THE INVENTION

First Exemplary Embodiment

A first exemplary embodiment of the present invention will be described with reference to the drawings.

Figure 1:
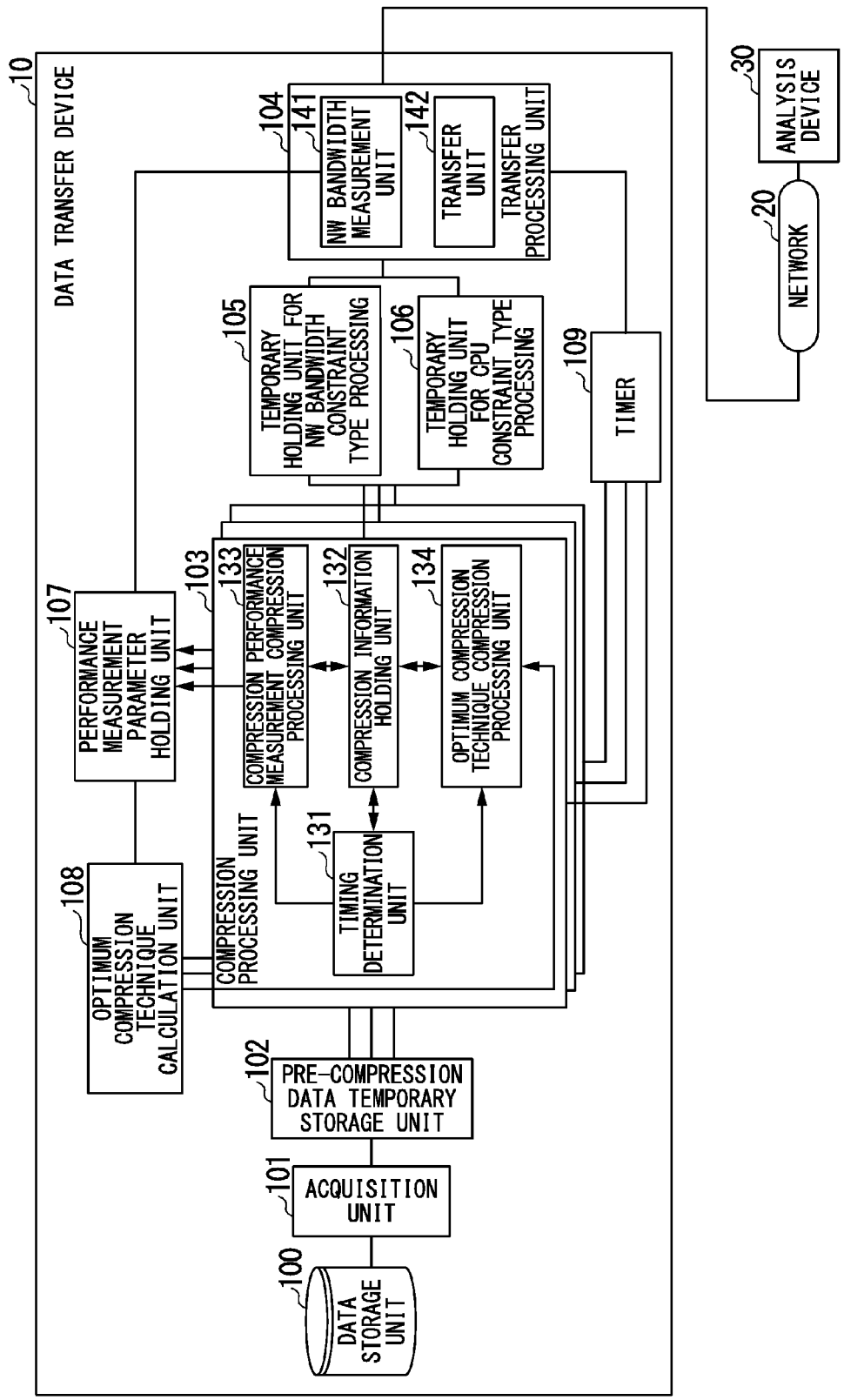
FIG. 1 is a diagram showing an example of a configuration of a data transfer system according to a first exemplary embodiment of the present invention.

As shown in FIG. 1, a data transfer system according to the first exemplary embodiment of the present invention has a connection data transfer device 10 and an analysis device (external device) 30 mutually connected through a network 20. In the example shown in FIG. 1, each of the number of data transfer devices 10 and the number of analysis devices 30 is one. However, each of the number of data transfer devices 10 and the number of analysis devices 30 may be two or more.

The data transfer device 10 stores data in a raw state before analysis is performed. Data may be data from a service client or data from a sensor.

The analysis device 30 performs an analysis process on the transferred data.

The data transfer device 10 includes a data storage unit 100, an acquisition unit 101, a pre-compression data temporary holding unit 102, a compression processing unit 103, a transfer processing unit 104, a temporary holding unit 105 for NW bandwidth constraint type processing, a temporary holding unit 106 for CPU constraint type processing, a performance measurement parameter holding unit 107, an optimum compression technique calculation unit 108, and a timer 109. The temporary pre-compression data holding unit 102 may be referred to as a first holding unit 102. The temporary holding unit 105 for the NW bandwidth constraint type processing may be referred to as a second holding unit 105. The temporary holding unit 106 for the CPU constraint type processing may be referred to as a third holding unit 106. The performance measurement parameter holding unit 107 may be referred to as a parameter holding unit 107. The optimum compression technique calculation unit 108 may be referred to as a calculation unit 108.

The data storage unit 100 is configured to hold data. The data storage unit 100 may be, for example, a database, a file system, or a message queue.

The acquisition unit 101 reads data from the data storage unit 100 in units of blocks having a certain constant size. There is no constraint on the block size.

The first holding unit 102 temporarily holds data which is a target of compression processing by the compression processing unit 103. This first holding unit 102 buffers data acquired by the acquisition unit 101 and absorbs a processing speed difference between the acquisition unit 101 and the compression processing unit 103.

Although the case in which there are three compression processing units 103 is shown in FIG. 1, the number of compression processing units 102 is not limited to three. The number of compression processing units 103 may be only one. Hereinafter, the case in which there is one compression processing unit 103 will be described. The compression processing unit 103 compresses compression target data read from the first holding unit 102 in compression processing. The compression processing unit 103 outputs the compressed data to the second holding unit 105 or the third holding unit 106. The compression processing may include a compression technique in which Compression Ratio=1 which is non-compression. This compression processing unit 103 performs processing in parallel. For example, the compression processing unit 103 includes a plurality of CPU cores and the plurality of CPU cores may execute processing in parallel.

The compression processing unit 103 includes a timing determination unit 131, a compression information holding unit 132, a compression performance measurement compression processing unit 133, and an optimum compression technique compression processing unit 134. The compression information holding unit 132 may be referred to as an information holding unit 132. The compression performance measurement compression processing unit 133 may be referred to as a first compression processing unit 133. The optimum compression technique compression processing unit 134 may be referred to as a second compression processing unit 134.

The timing determination unit 131 determines an acquisition timing at which a compression performance pattern is acquired and a registration timing at which the compression performance parameter is registered through the first compression processing unit 133. In this exemplary embodiment, the compression processing unit 103 periodically acquires and registers the compression performance parameter during compression processing. The acquisition timing and the registration timing are timings which arrive at every predetermined time interval.

In this exemplary embodiment, the timing determination unit 131 executes a determination of whether an acquisition timing condition of the compression performance parameter is satisfied and a determination of whether a registration timing condition of the compression performance parameter is satisfied during the compression processing.

The case in which the timing determination unit 131 determines that the acquisition timing condition of the compression performance parameter is satisfied, for example, the case in which the timing determination unit 131 determines that a predetermined time has elapsed from the acquisition timing of a previous compression performance parameter, will be described. In this case, the timing determination unit 131 determines that the it is the acquisition timing of the compression performance parameter.

The case in which the timing determination unit 131 determines that the registration timing condition of the compression performance parameter is satisfied, that is, for example, the case in which the timing determination unit 131 determines that a predetermined time has elapsed from the registration timing of a previous compression performance parameter, will be described. In this case, the timing determination unit 131 determines that it is the registration timing of the compression performance parameter.

The method in which the timing determination unit 131 determines the timing is not limited. An example of the determination method is a method of providing a timing determination flag, setting the timer 109 and turning on the flag when a predetermined time has elapsed.

Specifically, in an initial state, each of the acquisition flag for determining the acquisition timing condition of the compression performance parameter and the registration flag for determining the registration timing condition of the compression performance parameter is turned on.

The timing determination unit 131 turns off the acquisition flag when the compression performance parameter is acquired by executing the compression processing based on one selected compression processing technique. Further, the timing determination unit 131 determines whether a predetermined time has elapsed from when the acquisition flag is turned off based on a time measurement result by the timer 109. If it is determined that the predetermined time has elapsed from when the acquisition flag is turned off, the timing determination unit 131 turns on the acquisition flag. When the acquisition flag is turned on, the timing determination unit 131 determines that the acquisition timing condition of the compression performance parameter is satisfied, i.e., that it is the acquisition timing of the compression performance parameter.

When the compression performance parameters based on all compression processing techniques executable by the compression processing unit 103 are registered, the timing determination unit 131 turns off the registration flag and determines whether a predetermined time has elapsed from when the registration flag is turned off based on a time measurement result by the timer 109. If it is determined that the predetermined time has elapsed from when the registration flag is turned off, the timing determination unit 131 turns on the registration flag. When the registration flag is on, the timing determination unit 131 determines that the registration timing condition of the compression performance parameter is satisfied, i.e., that it is the registration timing of the compression performance parameter.

The information holding unit 132 stores the acquisition flag and the registration flag. In addition, the information holding unit 132 stores information indicating a predetermined time indicating an interval from off of the acquisition flag/registration flag to on.

The information holding unit 132 holds information to be used in determination processing by the timing determination unit 131 and program data of a compression algorithm which is a compression processing technique. In addition, the information holding unit 132 holds information indicating an optimum compression technique determined by the calculation unit 108, information indicating a technique of compression processing of compressed data held in the second holding unit 105, and information indicating a technique of compression processing of compressed data held in the third holding unit 106.

The case in which the timing determination unit 131 determines that the acquisition timing condition of the compression performance parameter is satisfied will be described. In this case, the first compression processing unit 133 performs compression processing in one of all the compression processing techniques executable by the compression processing unit 103 while measuring compression performance.

The case in which the timing determination unit 131 determines that the registration timing condition of the compression performance parameter is satisfied will be described. In this case, the first compression processing unit 133 calculates a compression performance parameter for every compression processing technique based on the measurement information obtained by compression performance measurement. Further, the first compression processing unit 133 writes the calculated compression performance parameter to the parameter holding unit 107.

In this exemplary embodiment, the first compression processing unit 133 calculates an average value of each of a compression processing speed and a compression ratio within a predetermined time as a compression performance parameter.

Specifically, when the timing determination unit 131 determines that the acquisition timing condition of the compression performance parameter is satisfied, the first compression processing unit 133 acquires a total size $S_{org}$ of an amount of data before compression serving as a compression processing target within an interval time (a predetermined time, for example, 1 sec) and a total size $S_{comp}$ of an amount of data after the compression within the interval time, and saves them in an embedded memory region.

Thereafter, when the timing determination unit 131 determines that the registration timing condition of the compression performance parameter is satisfied, the first compression processing unit 133 obtains a quotient by dividing a sum of total sizes $S_{org}$ of data on which compression processing has been performed within the interval time by the interval time. This quotient is used as an average value of the compression processing speed. The first compression processing unit 133 obtains a quotient by dividing a sum of total sizes $S_{comp}$ of the data amount after the compression by a sum of total sizes $S_{org}$ of the data amount before the compression and uses the quotient as an average value of the compression ratio.

The first compression processing unit 133 writes the calculated average value of the compression processing speed and the average value of the compression ratio as the compression performance parameter of the executed compression processing technique to the parameter holding unit 107.

The second compression processing unit 134 executes either of the first compression processing technique (first compression technique) and the second compression processing technique (second compression technique). The first compression processing technique is a compression processing technique set by the calculation unit 108 as the optimum compression technique of executing the compression processing (hereinafter referred to as NW bandwidth constraint processing or NW constraint type (compression) processing) in which the NW bandwidth may be the bottleneck. The second compression processing technique is a compression processing technique set by the calculation unit 108 as the optimum compression technique of executing the compression processing (hereinafter referred to as CPU constraint processing or CPU constraint type (compression) processing) in which the CPU processing may be the bottleneck. This second compression processing unit 134 switches the compression processing technique to be executed to the CPU constraint processing type compression processing technique or the NW constraint processing type compression processing technique according to data amounts of compressed data held by the subsequent-stage temporary holding units (the second holding unit 105 and the third holding unit 106).

When the NW constraint type processing is used, the processing speed of the transfer processing may be constrained as compared with the processing speed of the compression processing. When the CPU constraint type processing is used, the processing speed of the compression processing may be constrained as compared with the processing speed of the transfer processing. That is, the compression ratio of the CPU constraint type processing is higher than that of the NW constraint type processing.

When the data amount of the compressed data held by the subsequent-stage temporary holding unit is less than a predetermined value, the second compression processing unit 134 compresses target data through the NW constraint type compression processing and stores the compressed data in the subsequent-stage temporary holding unit. When the data amount of the compressed data held by the subsequent-stage temporary holding unit is greater than the predetermined value (threshold value), the second compression processing unit 134 compresses target data through the CPU constraint type compression processing and stores the compressed data in the subsequent-stage temporary holding unit.

In this exemplary embodiment, the NW constraint type compression processing is processing in which a compressed data amount per unit time is greater than a network bandwidth. The CPU constraint compression processing is processing in which the compressed data amount per unit time is less than the network bandwidth. The network bandwidth is an available network bandwidth as the network bandwidth of the network 20.

The second compression processing unit 134 executes the CPU constraint type processing or the NW constraint type processing according to the optimum compression technique determined by the calculation unit 108.

In this exemplary embodiment, the case in which the second compression processing unit 134 determines that the second holding unit 105 can store data based on an amount of data held by the second holding unit 105 will be described. In this case, the second compression processing unit 134 compresses data input according to a compression algorithm determined as the NW constraint type optimum compression technique and stores the compressed data in the second holding unit 105.

The case in which the second compression processing unit 134 determines that the second holding unit 105 cannot store data and the third holding unit 106 can store data based on amounts of data held by the second holding unit 105 and the third holding unit 106 will be described. In this case, the second compression processing unit 134 compresses data input according to a compression algorithm determined as the CPU constraint type optimum compression technique and stores the compressed data in the third holding unit 106.

The transfer processing unit 104 includes a NW bandwidth measurement unit 141 and a transfer unit 142. The NW bandwidth measurement unit 141 may be referred to as a measurement unit 141. The transfer processing unit 104 transfers the compressed data to a transfer destination while measuring transfer performance.

The measurement unit 141 measures transfer performance during transfer processing. When it is determined that the registration timing condition of the transfer performance parameter is satisfied, the measurement unit 141 calculates the transfer performance parameter based on measurement information obtained by the transfer performance measurement and writes the calculated transfer performance parameter to the parameter holding unit 107.

In this exemplary embodiment, the measurement unit 141 calculates a network bandwidth in a predetermined constant time, that is, a transfer data amount per unit time (may be a total transfer data amount per unit time), as the transfer performance parameter.

Specifically, the measurement unit 141 measures a transfer size $S_{tran}$ of an amount of data transferred to a transfer destination for every interval of a predetermined time T1. The measurement unit 141 determines that the registration timing condition of the transfer performance parameter is satisfied when a predetermined time T2 (T2>T1) has elapsed. In this case, the measurement unit 141 obtains a quotient by dividing a sum of transfer sizes $S_{tran}$ of transferred data for a time T2 by the time T2. Further, the measurement unit 141 writes the obtained quotient (that is, the network bandwidth) as the transfer performance parameter to the parameter holding unit 107.

The transfer unit 142 acquires data from previous-stage holding units (the second holding unit 105 and the third holding unit 106) and transfers the data to the analysis device 30. The transfer unit 142 preferentially transfers the data compressed by the CPU constraint type processing among the compressed data stored in the temporary holding units 105 and 106.

In this exemplary embodiment, the transfer unit 142 preferentially transfers the compressed data stored in the third holding unit 106 to the analysis device 30 (transfer destination). The transfer unit 142 transfers the compressed data stored in the second holding unit 105 to the analysis device 30 when there is no compressed data in the third holding unit 106.

The second holding unit 105 and the third holding unit 106 are examples of the temporary holding unit that temporarily holds the compressed data. Although the case in which the second holding unit 105 and the third holding unit 106 are separated will be described in this exemplary embodiment, it is not limited thereto. The second holding unit 105 and the third holding unit 106 may be integrated.

The second holding unit 105 is a buffer that stores data compressed by the second compression processing unit 134 through an NW constraint type optimum compression technique.

The third holding unit 106 is a buffer that stores data compressed by the second compression processing unit 134 through a CPU constraint type optimum compression technique.

The calculation unit 108 selects a compression processing technique (optimum compression technique) that optimizes effective throughput, and sets the selected technique in the information holding unit 132 of the compression processing unit 103.

In this exemplary embodiment, the calculation unit 108 selects at least one optimum compression algorithm to be executed in the second compression processing unit 134 of the compression processing unit 103. Further, the calculation unit 108 determines whether each selected compression algorithm is the NW constraint type or the CPU constraint type.

That is, the calculation unit 108 determines an optimum compression technique corresponding to the CPU constraint type and an optimum compression technique corresponding to the NW constraint type from among all of a plurality of different compression processing techniques (for example, compression algorithms or non-compression algorithms) executable by the compression processing unit 103.

The calculation unit 108 refers to the parameter holding unit 107 to determine the optimum compression technique corresponding to the CPU constraint type and the optimum compression technique corresponding to the NW constraint type based on the compression performance parameter by the compression processing of the compression processing unit 103 and the transfer performance parameter by the transfer processing of the transfer processing unit 104. The calculation unit 108 determines, as the optimum compression technique, a compression processing technique in which the effective throughput is maximized when the compression processing unit 103 performs compression processing (also including non-compression processing) on processing target data.

The timer 109 measures time. This timer 109, for example, may measure the time by counting down a determined time from a start point of time.

Figure 2:
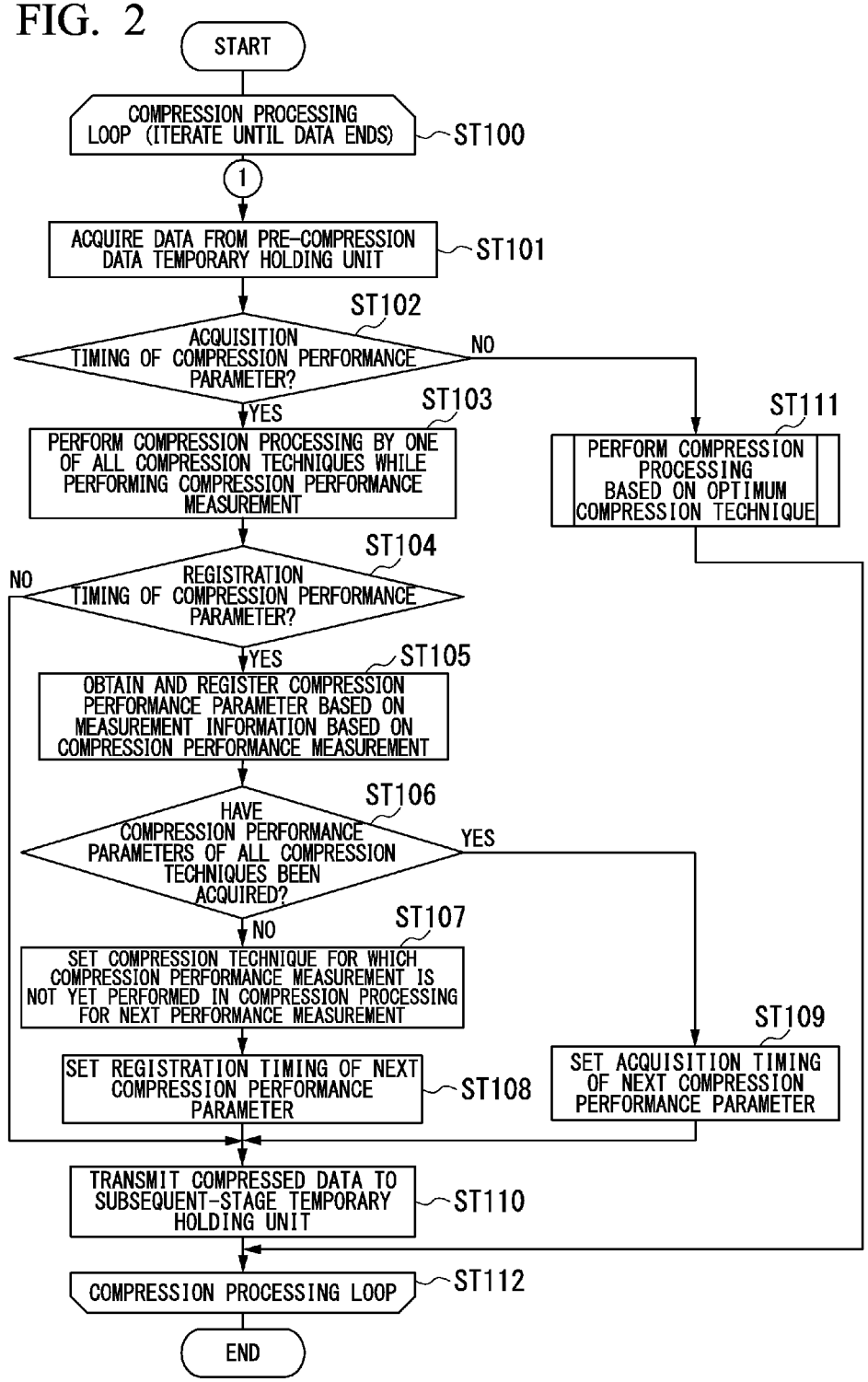
FIG. 2 is a flowchart for describing an example of a compression processing method according to the first exemplary embodiment of the present invention.
Figure 3:
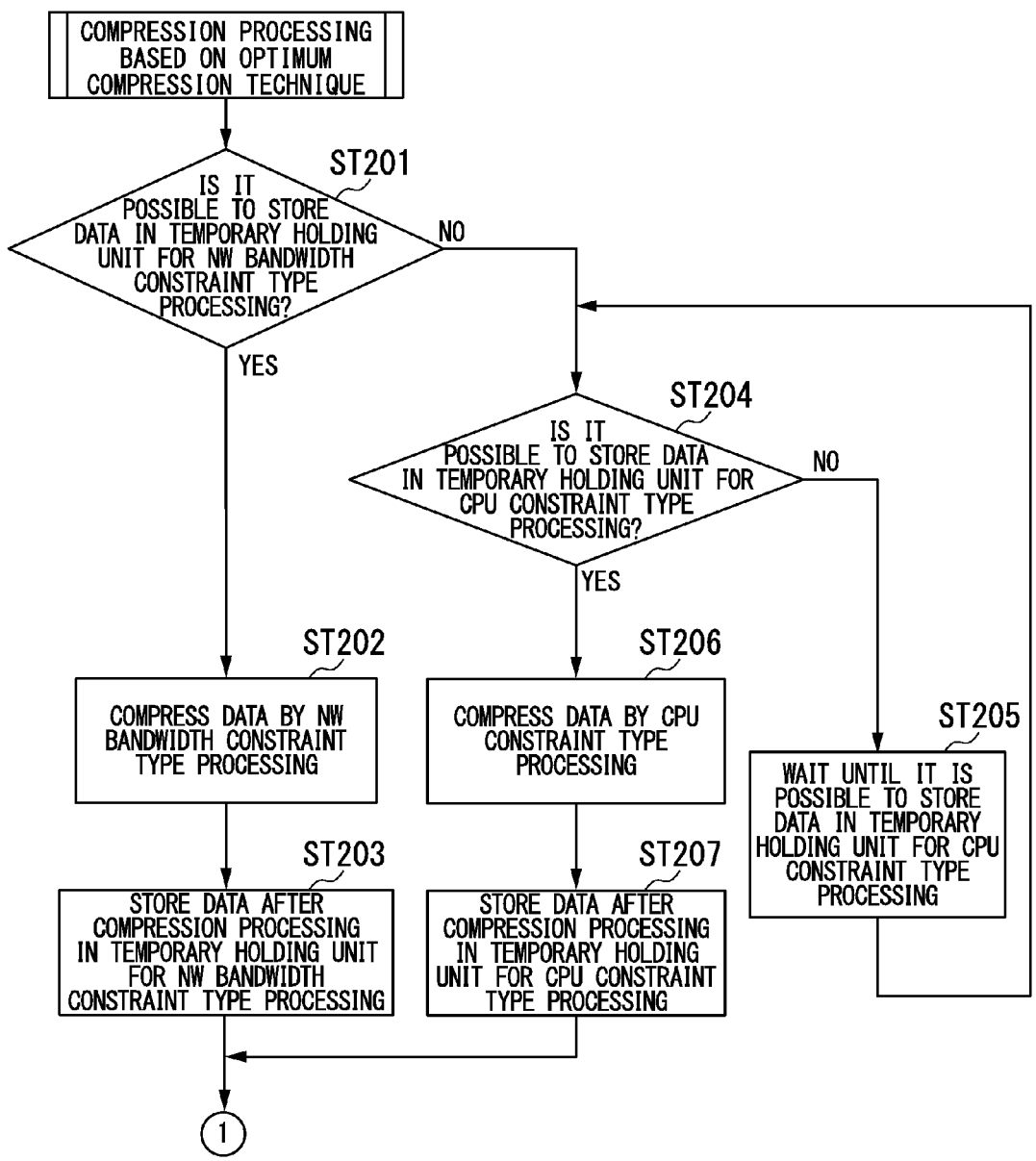
FIG. 3 is a flowchart for describing an example of partial processing included in the compression processing method according to the first exemplary embodiment of the present invention.

Next, an example of a compression processing method in this exemplary embodiment will be described with reference to FIGS. 2 and 3. FIG. 2 is a flowchart for describing the example of the compression processing method according to the first exemplary embodiment of the present invention. In addition, FIG. 3 is a flowchart for describing an example of partial processing included in the flowchart shown in FIG. 2.

(Step ST100)

The compression processing unit 103 compresses data using a plurality of compression processing techniques. The compression processing unit 103 iterates the compression processing until the processing is stopped, for example, until there is no compression target data stored in the first holding unit 102. In this exemplary embodiment, the compression processing unit 103 causes the second compression processing unit 134 to execute the compression processing when it is determined that the acquisition timing condition of the compression performance parameter is not satisfied. On the other hand, when it is determined that the acquisition timing condition of the compression performance parameter is satisfied, the compression processing unit 103 causes the first compression processing unit 133 to execute the compression processing.

(Step ST101)

The compression processing unit 103 acquires data from the first holding unit 102 in units of blocks having a constant size.

(Step ST102)

The timing determination unit 131 of the compression processing unit 103 determines whether the acquisition timing of the compression performance parameter arrives. That is, the timing determination unit 131 refers to the information holding unit 132 to determine whether the acquisition timing condition of the compression performance parameter is satisfied. In this exemplary embodiment, the timing determination unit 131 determines that the acquisition timing condition of the compression performance parameter is satisfied when the acquisition flag is on.

(Step ST103)

When the acquisition flag is on and it is determined that the acquisition timing condition of the compression performance parameter is satisfied, the timing determination unit 131 instructs the first compression processing unit 133 to execute the compression processing.

Thereby, the first compression processing unit 133 refers to the information holding unit 132 and executes the compression processing through one technique of all the compression processing techniques while measuring the compression performance. In this exemplary embodiment, a list of all the compression processing techniques (for example, compression algorithms 1, 2, 3, 4, and 5) registered in the information holding unit 132 is held in the information holding unit 132. The first compression processing unit 133 refers to this list, and, for example, selects the compression algorithm to be executed in order from the compression algorithm written at the top of the list. In this exemplary embodiment, compression algorithm 1 is written at the top of the list and compression algorithms 2, 3, 4, and 5 are written in order under this compression algorithm 1. The first compression processing unit 133 executes the compression processing according to compression algorithm 1 while measuring the compression performance. The first compression processing unit 133 writes measurement information of the compression performance to its embedded storage region and temporarily holds the written measurement information.

(Step ST104)

The timing determination unit 131 refers to the information holding unit 132 to determine whether a registration timing of the compression performance parameter arrives. That is, the timing determination unit 131 determines whether the registration timing condition of the compression performance parameter is satisfied. In this exemplary embodiment, the timing determination unit 131 determines that the registration timing condition of the compression performance parameter is satisfied when the registration flag is on (YES in step ST104).

When the registration flag is off, the compression processing unit 103 proceeds to the process of step ST110 (NO in step ST104).

(Step ST105)

When the registration flag is on and it is determined that the registration timing condition of the compression performance parameter is satisfied, the timing determination unit 131 instructs the first compression processing unit 133 to register the compression performance parameter. Thereby, the first compression processing unit 133 obtains the compression performance parameter based on measurement information. Further, the first compression processing unit 133 writes the obtained compression performance parameter to the parameter holding unit 107. Thereby, the compression processing speed and the compression ratio which are compression performance parameters of the compression algorithm 1 are registered in the parameter holding unit 107.

(Step ST106)

The first compression processing unit 133 determines whether compression performance parameters for all compression processing techniques have been acquired. For example, the first compression processing unit 133 refers to a list of compression algorithms held in the information holding unit 132 to determine whether the flag is set in the lowest compression algorithm 5.

(Step ST107)

When it is determined that no flag is set in the lowest compression algorithm 5 of the list, the first compression processing unit 133 determines that compression performance parameters for all compression processing techniques are not acquired (NO in step ST106). In this case, the first compression processing unit 133 sets a compression technique for which compression performance measurement is not yet performed to the compression processing technique for the next performance measurement.

Here, for example, the first compression processing unit 133 sets the flag indicating that the compression processing of compression algorithm 1 has been executed in the compression algorithm list. That is, the first compression processing unit 133 writes information indicating that a lower-stage compression algorithm (compression algorithm 2 in an example here) than the compression algorithm in which the flag is set in the list is the compression processing technique for the next performance measurement to the information holding unit 132 by setting the flag corresponding to the executed compression algorithm.

(Step ST108)

The first compression processing unit 133 sets the registration timing of the next compression performance parameter. In this exemplary embodiment, the first compression processing unit 133 sets the registration flag to be turned off and sets the timer 109 to count the passage of a predetermined time.

(Step ST109)

On the other hand, when it is determined that the flag is set in the lowest compression algorithm 5 in the determination process of step ST106, the first compression processing unit 133 determines that the compression performance parameters for all the compression processing techniques have been acquired (YES in step ST106). In this case, the first compression processing unit 133 sets the acquisition timing of the next compression performance parameter. In this exemplary embodiment, the first compression processing unit 133 sets the acquisition flag to be turned off and sets the timer 109 to count the passage of a predetermined time. In addition, the first compression processing unit 133 deletes the flags of the compression algorithm list.

(Step ST110)

The first compression processing unit 133 transmits data compressed by compression algorithm 1 in step ST103 to the subsequent-stage temporary holding unit. In this exemplary embodiment, the first compression processing unit 133, for example, determines whether a data amount of the third holding unit 106 is greater than or equal to a predetermined threshold value. When the data amount of the third holding unit 106 is less than the predetermined threshold value, the first compression processing unit 133 preferentially transmits the compressed data to the third holding unit 106. On the other hand, when the data amount of the third holding unit 106 is greater than or equal to the predetermined threshold value, the first compression processing unit 133 transmits the compressed data to the second holding unit 105.

(Step ST111)

When the acquisition flag is off in the determination process of step ST102 and it is determined that the acquisition timing condition of the compression performance parameter is not satisfied (NO in step ST102), the timing determination unit 131 instructs the second compression processing unit 134 to execute the compression processing. Thereby, the second compression processing unit 134 refers to the information holding unit 132 and executes the compression processing on the data acquired in the process of step ST101 through the compression algorithm of the optimum compression technique determined by the calculation unit 108. Details of the compression processing by the second compression processing unit 134 will be described below with reference to FIG. 3.

(Step ST112)

When the compression processing has been stopped such as the case where there is no compression target data stored in the first holding unit 102, the compression processing unit 103 ends the process of steps ST101 to ST111.

As described above, the compression processing unit 103 can execute the compression processing while measuring the compression performance, calculate a compression performance parameter for each compression processing technique, and register them in the parameter holding unit 107. Consequently, it is not necessary to collect the parameter to be used in the determination of the optimum compression technique by the calculation unit 108 from test data or the like in advance. As a result, it is possible to reduce the effort necessary for setting in advance.

In addition, the compression processing unit 103 can periodically register a compression performance parameter. Thereby, even when the compression performance parameter of each compression processing technique has changed, it is possible to follow the change and update the compression performance parameter. Because the compression performance changes according to content of data, it is effective, for example, when data in which content is different is transferred in the middle.

Further, the compression processing unit 103 can periodically perform switching to the compression processing by the first compression processing unit 133 while executing the compression processing based on the optimum compression technique by the second compression processing unit 134. Thereby, there is an advantage in that it is possible to have an effect of compression processing by the second compression processing unit 134 as will be described below and a following property associated with a change in a parameter by simplifying the setting of a parameter for use in the determination of the optimum compression technique.

Next, an example of compression processing by the second compression processing unit 134 will be described in detail with reference to FIG. 3.

(Step ST201).

The second compression processing unit 134 refers to an amount of data held by the second holding unit 105 to determine whether there is available space in the second holding unit 105 and data can be stored. For example, the second compression processing unit 134 determines that there is available space (data can be stored) when an amount of data held by the second holding unit 105 is less than a predetermined threshold value.

(Step ST202)

When it is determined that data can be stored in the second holding unit 105 (YES in step ST202), the second compression processing unit 134 compresses the data acquired in step ST101 through the NW constraint type optimum compression technique. That is, the second compression processing unit 134 compresses the data acquired from the first holding unit 102 according to a compression algorithm determined as the NW constraint type optimum compression technique.

(Step ST203)

The second compression processing unit 134 stores the compressed data in the second holding unit 105.

(Step ST204)

When it is determined that no data can be stored in the second holding unit 105 (NO in step ST201), the second compression processing unit 134 refers to an amount of data held by the third holding unit 106 to determine whether there is available space in the third holding unit 106 and data can be stored. For example, when the amount of data held by the third holding unit 106 is less than a predetermined threshold value, the second compression processing unit 134 determines that there is available space (data can be stored).

(Step ST205)

When it is determined that no data can be stored in the third holding unit 106 (NO in step ST204), the second compression processing unit 134 waits until there is available space in the third holding unit 106, that is, until the amount of data held by the third holding unit 106 is less than the predetermined threshold value.

(Step ST206)

When it is determined that there is available space in the third holding unit 106 and data can be stored (YES in step ST204), the second compression processing unit 134 compresses the data acquired in step ST101 through the CPU constrain type optimum compression technique. That is, the second compression processing unit 134 compresses the data acquired from the first holding unit 102 according to a compression algorithm determined as the CPU constraint type optimum compression technique.

(Step ST207)

The second compression processing unit 134 stores the compressed data in the third holding unit 106.

As described above, the compression processing unit 103 preferentially stores data in the second holding unit 105. As a result, it is possible to perform processing having a high compression ratio while the transfer processing unit 104 supplies data to be transmitted to effectively use an NW bandwidth.

Figure 4:
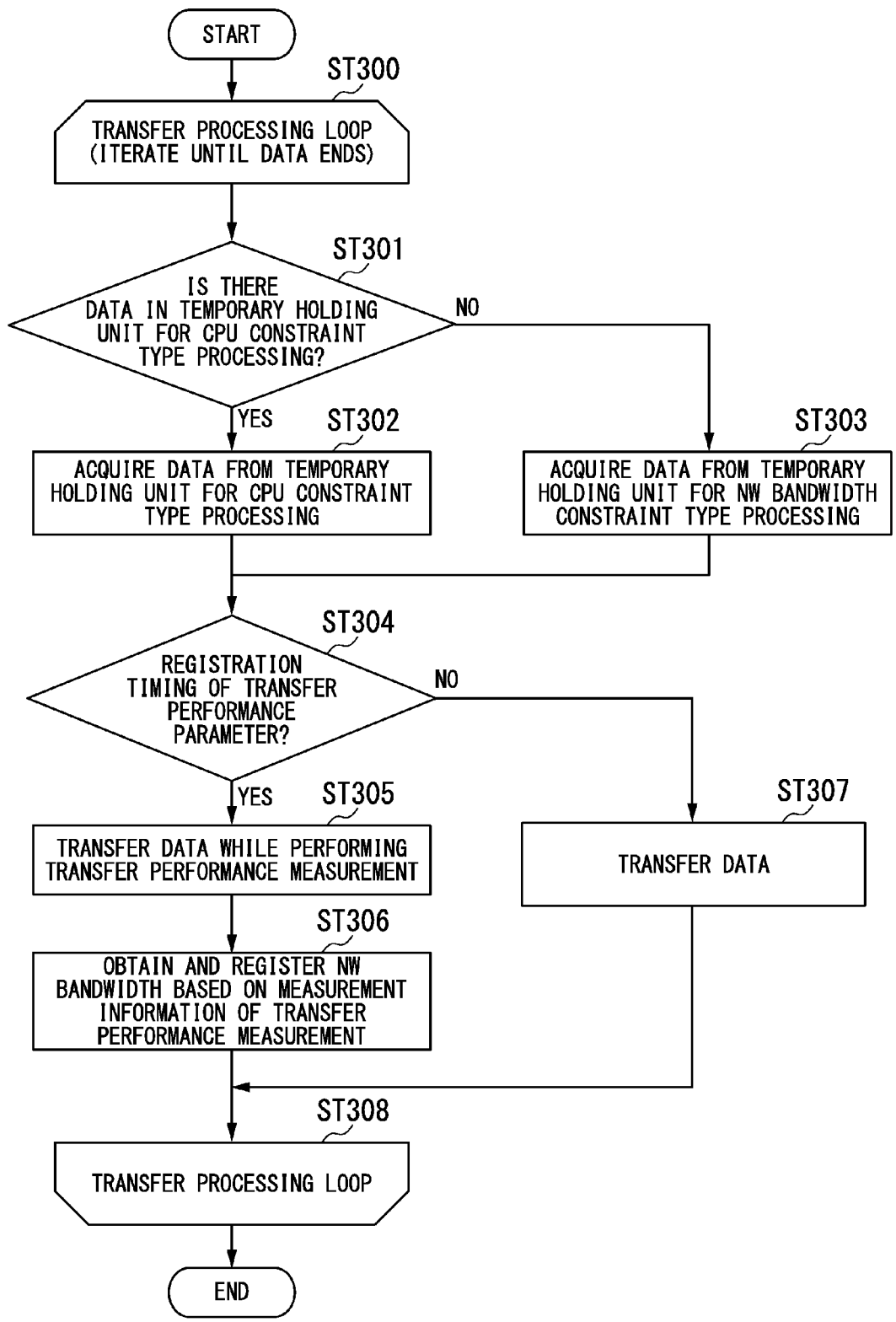
FIG. 4 is a flowchart for describing an example of a transfer processing setting method according to the first exemplary embodiment of the present invention.

Next, an example of a transfer processing method in this exemplary embodiment will be described with reference to FIG. 4. FIG. 4 is a flowchart for describing the example of the transfer processing method in this exemplary embodiment.

(Step ST300)

For example, when a power supply of the data transfer device 10 is turned ON, the transfer processing unit 104 iterates a process of acquiring data from a previous-stage buffer and transferring it until data transfer processing is stopped (for example, until there is no compression target data stored in the first holding unit 102).

(Step ST301)

The transfer processing unit 104 confirms whether compressed data is stored in the third holding unit 106.

(Step ST302)

When the compressed data is stored in the third holding unit 106 (YES in step ST301), the transfer processing unit 104 acquires the compressed data from the third holding unit 106.

(Step ST303)

When no compressed data is stored in the third holding unit 106 (NO in step ST301), the transfer processing unit 104 acquires the compressed data from the second holding unit 105.

(Step ST304)

The transfer processing unit 104 determines whether a registration timing of the transfer performance parameter arrives. That is, the timing determination unit 131 determines whether the registration timing condition of the transfer performance parameter is satisfied.

(Step ST305)

When it is determined that the registration timing condition of the transfer performance parameter is satisfied (YES in step ST304), the transfer processing unit 104 transfers the compressed data acquired from the second holding unit 105 or the third holding unit 106 to the analysis device 30 via the network 20 while measuring transfer performance.

(Step ST306)

The transfer processing unit 104 obtains a network bandwidth N based on the measurement information measured in step ST305. Further, the transfer processing unit 104 writes the obtained network bandwidth N to the parameter holding unit 107. Thereby, the network bandwidth N, which is the transfer performance parameter, is registered in the parameter holding unit 107.

(Step ST307)

When it is determined that the registration timing condition of the transfer performance parameter is not satisfied (NO in step ST304), the transfer processing unit 104 transfers the compressed data acquired from the second holding unit 105 or the third holding unit 106 to the analysis device 30 via the network 20. That is, when it is determined that the registration timing condition of the transfer performance parameter is not satisfied, the transfer processing unit 104 transfers the compressed data without measuring measurement information.

(Step ST308)

When data transfer processing by the transfer processing unit 104 has been stopped such as the case where there is no compression target data stored in the first holding unit 102, the transfer processing unit 104 ends the process of steps ST301 to 307.

As described above, the transfer processing unit 104 can execute transfer processing while measuring transfer performance, calculate a transfer performance parameter, and register it in the parameter holding unit 107. Consequently, it is not necessary to collect a parameter to be used in a determination of an optimum compression technique by the calculation unit 108 from test data or the like in advance. As a result, it is possible to reduce the effort necessary for setting in advance. In addition, even in an environment in which a parameter having an influence on transfer performance changes, it is possible to follow the change and update the transfer performance parameter.

In addition, by performing an operation as described above, the data in the third holding unit 106 is preferentially transmitted. The data in the third holding unit 106 can be expected to have a small data size through compression having higher efficiency. Consequently, the transmission of a lot of such data leads to effective throughput improvement. However, because the throughput of data compressed by the CPU constraint type processing does not use up the NW band, waste occurs in the NW band for only the data. Data compressed by the NW constraint type processing is transmitted so that waste does not occur. Consequently, it is possible to effectively use the NW bandwidth in this exemplary embodiment.

Figure 5:
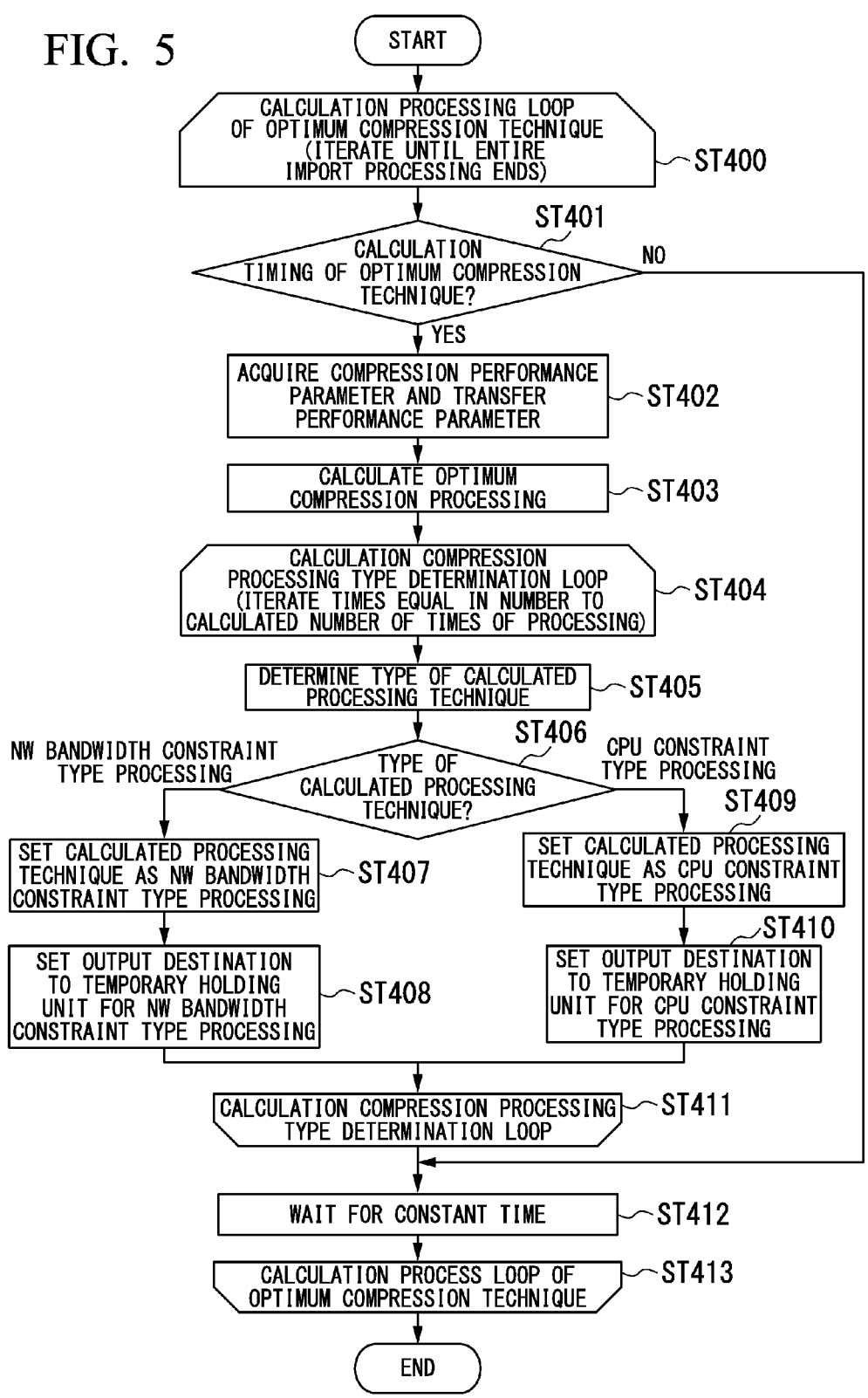
FIG. 5 is a flowchart for describing an example of a calculation processing method of an optimum compression technique according to the first exemplary embodiment of the present invention.

Next, an example of a calculation method of an optimum compression technique in this exemplary embodiment will be described with reference to FIG. 5. FIG. 5 is a flowchart for describing the example of the calculation method of the optimum compression technique in this exemplary embodiment.

The data transfer device 10 according to this exemplary embodiment calculates a combination of optimum compression processing techniques using a mathematical model. Further, the data transfer device 10 sets a compression algorithm which is the NW constraint type optimum compression technique and a compression algorithm which is the CPU constraint type optimum compression technique based on a calculation result. A detailed mathematical model will be described below. Here, the entire sequence will be described under the assumption that an optimum compression processing technique is selected based on the calculation result by the mathematical model in the calculation unit 108.

(Step ST400)

The calculation unit 108 iterates a process of calculating the optimum compression technique until the entire import process ends, for example, until the compression processing shown in FIGS. 2 and 3 and the transfer processing shown in FIG. 4 end.

(Step ST401)

The calculation unit 108 determines whether optimum compression technique calculation timing arrives. That is, the calculation unit 108 determines whether a calculation timing condition of the optimum compression technique is satisfied. When it is determined that a predetermined time has elapsed from the previous process of calculating the optimum compression technique, the calculation unit 108 may determine that the calculation timing condition of the optimum compression technique is satisfied. The calculation unit 108 may determine whether the calculation timing condition of the optimum compression technique is satisfied using the time measurement result by the timer 109 or the flag as described above.

(Step ST402)

When it is determined that the calculation timing condition of the optimum compression technique is satisfied (YES in step ST401), the calculation unit 108 reads a compression performance parameter and a transfer performance parameter held in the parameter holding unit 107.

In this exemplary embodiment, the calculation unit 108 reads a compression processing speed $C_i$ and a compression ratio $R_i$ of each compression algorithm i ("i" indicates an identification number of the algorithm) as compression performance parameters from the parameter holding unit 107. In addition, the calculation unit 108 reads a network bandwidth N available as the transfer performance parameter from the parameter holding unit 107.

The calculation unit 108 reads other parameters necessary to calculate the optimum compression processing technique, for example, information about a degree of parallelism P or the like, from the parameter holding unit 107. The degree of parallelism P is the number of cores of a CPU provided in the compression processing unit 103 to execute parallel processing.

(Step ST403)

The calculation unit 108 determines at least one compression algorithm (optimum compression technique) for optimizing effective throughput based on a calculation result calculated by substituting the parameters read from the parameter holding unit 107 into the mathematical model. Further, the calculation unit 108 classifies the determined optimum compression technique as either of the CPU constraint type and the NW constraint type. It is preferable for the calculation unit 108 to determine two or more optimum compression techniques and set one or more CPU constraint type optimum compression techniques and one or more NW constraint type optimum compression techniques.

(Step ST404)

With respect to each determined optimum compression technique, the calculation unit 108 performs the setting of a type of compression algorithm of the optimum compression technique and the setting of a temporary holding unit being an output destination of compressed data by the optimum compression technique on the second compression processing unit 134 of the compression processing unit 103.

(Step ST405)

The calculation unit 108 determines a type of the determined optimum compression technique. That is, the calculation unit 108 determines a type of compression algorithm for optimizing effective throughput. Because a type determination process also uses a mathematical model, details will be described below.

(Step ST406)

The calculation unit 108 determines which of the CPU constraint type compression algorithm and the NW constraint type compression algorithm is a compression algorithm (optimum compression technique) determined to be compression processing for optimizing the effective throughput. Although details will be described below, the calculation unit 108 determines which of the CPU constraint type compression algorithm and the NW constraint type compression algorithm is it according to whether a product of the compression processing speed $C_i$ and the compression ratio $R_i$ of each compression algorithm i and the degree of parallelism P is greater than an available network bandwidth N.

(Step ST407)

For example, when it is determined that one of compression algorithms (optimum compression techniques) determined to be compression processing for optimizing the effective throughput is the NW constraint type, the calculation unit 108 sets the compression algorithm as the NW constraint type compression algorithm at the second compression processing unit 134.

(Step ST408)

In addition, in this case, the calculation unit 108 sets the output destination (temporary saving destination) of the compressed data generated through the optimum compression technique at the second holding unit 105.

For example, the calculation unit 108 registers information indicating that the compression algorithm determined to be the NW constraint type among the compression algorithms (optimum compression techniques) determined to be the compression processing for optimizing the effective throughput is the NW constraint type compression processing technique in the information holding unit 132. In addition, the calculation unit 108 registers information indicating that the compression algorithm for generating the compressed data to be saved in the second holding unit 105 is an optimum compression technique in the information holding unit 132.

(Step ST409)

When it is determined that one of the compression algorithms (optimum compression techniques) determined to be the compression processing for optimizing the effective throughput is the CPU constraint type processing, the calculation unit 108 sets the compression algorithm as the CPU constraint type compression algorithm in the second compression processing unit 134.

(Step ST410)

In addition, in this case, the calculation unit 108 sets the output destination (temporary saving destination) of compressed data generated through such an optimum compression technique at the third holding unit 106.

For example, the calculation unit 108 registers information indicating that the compression algorithm determined to be the CPU constraint type among the compression algorithms (optimum compression techniques) determined to be the compression processing for optimizing the effective throughput is the CPU constraint type compression processing technique in the information holding unit 132. In addition, the calculation unit 108 registers information indicating that the compression algorithm for generating the compressed data to be saved in the third holding unit 106 is the optimum compression technique in the information holding unit 132.

(Step ST411)

The calculation unit 108 determines whether determination processes have ended for all determined optimum compression techniques. When all the determination processes have not ended, the process returns to step ST404.

(Step ST412)

The calculation unit 108 waits for a constant time.

(Step ST413)

When the entire import processing has ended such as the case where the compression processing shown in FIGS. 2 and 3 and the transfer processing shown in FIG. 4 have ended, the calculation unit 108 ends the process of steps ST401 to 412. When the entire import processing has not ended, the process is iterated by returning to step ST401.

It is preferable to execute the setting of the compression processing technique for optimizing the effective throughput by the calculation unit 108 before data is transferred (that is, before transfer processing).

Although an example in which the calculation unit 108 is mounted within the data transfer device 10 has been described in this exemplary embodiment, it is not limited to this configuration. The calculation unit 108 may be a device separated from the data transfer device 10.

Although the second holding unit 105 and the third holding unit 106 have been described as separate components in this exemplary embodiment, it is not limited to this configuration. The second holding unit 105 and the third holding unit 106 may be configured by one storage device. In this case, the second compression processing unit 134 designates a data amount according to a maximum storage capacity of the second holding unit 105 as a threshold value and determines whether an amount of data stored in the storage device is less than the threshold value. This compression processing unit 103 may refer to attachment information assigned to data stored in the storage device to determine whether the data processed through the NW constraint type compression processing is less than the threshold value.

That is, a process of determining whether there is available space in the second holding unit 105 described in this exemplary embodiment is an example of a process of determining whether an amount of data scheduled to be transferred by the transfer processing unit 104 is less than a predetermined value and is an example of a process of determining whether an amount of data processed by the NW constraint type compression processing among data scheduled to be transferred by the transfer processing unit 104 is less than a predetermined value.

With the above-described configuration, the size of compressed data to be held by the third holding unit 106 can be expected to be reduced through compression processing having higher efficiency (the efficiency of the CPU constraint type compression processing can be higher than that of the NW constraint type compression processing in this exemplary embodiment). Thus, the effective throughput is improved by transferring more compressed data held by the third holding unit 106.

Here, because the throughput of the compressed data generated by the CPU constraint type processing does not use up the NW band, waste occurs in the NW band for only the compressed data.

As described above, the improvement of the effective throughput and the effective use of the NW band have a trade-off relationship.

In order to prevent this waste from occurring, the data transfer device 10 preferentially transfers compressed data held by the third holding unit 106 and the second holding unit 105 holds a constant amount of compressed data. Thereby, the data transfer device 10 can hold a constant amount of compressed data as compressed data to be transferred.

Consequently, the transfer processing unit 104 can continuously transfer the compressed data held by the third holding unit 106 or the second holding unit 105. As a result, it is possible to effectively use the NW bandwidth.

In addition, in order to improve the effective throughput, the data transfer device 10 generates compressed data through the CPU constraint type processing to preferentially transfer the compressed data in a state in which a constant amount of compressed data is held in the second holding unit 105. Thereby, the effective throughput is improved because it is possible to transfer more data compressed through compression processing having higher efficiency.

Therefore, the data transfer device 10 according to this exemplary embodiment can effectively use the NW band while promoting the improvement of the effective throughput by making a configuration as described above.

When the second holding unit 105 does not hold a constant amount of compressed data, the data transfer device 10 preferentially executes the NW constraint type processing in which the processing speed of transfer processing may be constrained as compared with the processing speed of compression processing. In addition, when the second holding unit 105 holds a constant amount of compressed data, the data transfer device 10 preferentially transfers compressed data generated through the CPU constraint type processing in which the processing speed of compression processing may be constrained as compared with the processing speed of transfer processing. Through this configuration, the data transfer device 10 can use resources of the compression processing unit 103 at high efficiency and improve the effective throughput. In addition, the data transfer device 10 can shorten a required time until a constant amount of compressed data is stored in the second holding unit 105.

Figures 6, 7:
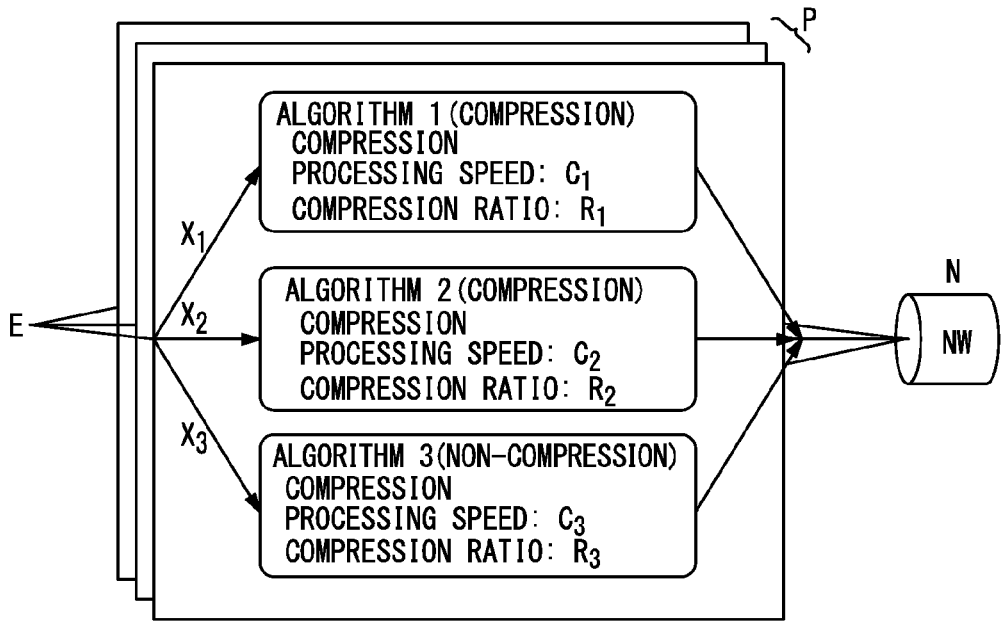
FIG. 6 is a conceptual diagram of compression and transfer processing using a compression algorithm according to the first exemplary embodiment of the present invention.
FIG. 7 is a table showing an actual example of a data transfer device according to the first exemplary embodiment of the present invention.

Next, an example of a mathematical model for calculating an optimum compression processing technique and determining a temporary holding unit being an output destination will be described with reference to FIG. 6. FIG. 6 is a conceptual diagram of compression and transfer processing using two types of compression algorithms.

Based on FIG. 6, the mathematical model for maximizing the effective throughput is constructed. The effective throughput to be maximized is denoted by "E." Processing throughput (also referred to as a compression processing speed) when one CPU core has been maximally used according to compression algorithm 1 is denoted by "$C_1$." Processing throughput when one CPU core has been maximally used according to compression algorithm 2 is denoted by "$C_2$." Compression ratios in compression algorithms 1 and 2 are denoted by "$R_1$" and "$R_2$," respectively. The compression efficiency is higher when a value indicating a ratio of a data size after compression for an original data size is smaller.

Because "compression ratio of non-compression processing=1," the non-compression processing is also included as one type of compression processing in this exemplary embodiment. Processing throughput when one CPU core has been maximally used according to non-compression algorithm 3 is denoted by "$C_3$." The compression ratio in this non-compression algorithm 3 is denoted by "$R_3$."

An available network bandwidth is denoted by "N." The CPU cost for transmitting data to the network 20 is ignored.

The processing throughputs $C_1$, $C_2$, and $C_3$ and the compression ratios $R_1$, $R_2$, and $R_3$ are compression performance parameters periodically measured by the first compression processing unit 133 and are information held in the parameter holding unit 107.

The following situations are assumed. The second compression processing unit 134 operates compression algorithms 1 and 2 and non-compression algorithm 3 at a set data ratio in processing in which the degree of parallelism P is "1." In other words, the second compression processing unit 134 independently executes each of compression algorithms 1 and 2 and non-compression algorithm 3 for data of the set ratio by maximally using one CPU core. When the set data ratio is 0%, this means that its compression algorithm is not executed.

In addition, the second compression processing unit 134 compresses data of a ratio of $x_1$ ($0 \leq x_1 \leq 1$) in compression algorithm 1 and compresses data of a ratio of $x_2$ ($0 \leq x_2 \leq 1$) in compression algorithm 2. The second compression processing unit 134 directly transfers data of a ratio of $x_3$ ($0 \leq x_3 \leq 1$) without compressing the data.

In the above-described situation, the throughput in which the second compression processing unit 134 can process compression using CPU resources in a degree of parallelism P of "1" is indicated by "$C_1 x_1 + C_2 x_2 + C_3 x_3$." In addition, the data throughput after compression processing by the compression processing unit 103 is indicated by "$C_1 x_1 R_1 + C_2 x_2 R_2 + C_3 x_3 R_3$."

When this process is processed in parallel in a CPU with the degree of parallelism P, the throughput in which compression can be processed is indicated by "$P \times (C_1 x_1 + C_2 x_2 + C_3 x_3)$." In addition, the data throughput after compression processing is indicated by "$P \times (C_1 x_1 R_1 + C_2 x_2 R_2 + C_3 x_3 R_3)$." When the compression processing unit 103 executes compression processing (including non-compression processing) through three CPU cores in parallel, the degree of parallelism P is "3."

The data throughput "$P \times (C_1 x_1 R_1 + C_2 x_2 R_2 + C_3 x_3 R_3)$" after the compression processing does not exceed the network bandwidth N. Consequently, the calculation unit 108 can obtain the optimum effective throughput E by solving the following linear programming problem.

Maximize:

$$E = P \times (C_1 x_1 + C_2 x_2 + C_3 x_3) \qquad \text{Formula (1)}$$

Subject to:

$$P \times (C_1 x_1 R_1 + C_2 x_2 R_2 + C_3 x_3 R_3) \leq N$$

$$0 \leq x_1 \leq 1$$

$$0 \leq x_2 \leq 1$$

$$0 \leq x_3 \leq 1$$

$$x_1 + x_2 + x_3 \leq 1$$

The calculation unit 108 can obtain a combination of the data ratios ($x_1$, $x_2$, and $x_3$) for maximizing the effective throughput E by solving this linear programming problem using a simplex method. The calculation unit 108 selects a combination of compression algorithms or non-compression algorithms in which the data ratio $x_i$ (i is a number for identifying the compression algorithm or the non-compression algorithm) is greater than 0 as an optimum compression processing combination. That is, when the data ratio is "$x_i \leq 0$," this means that there is no processing target data based on algorithm i. That is, this means that this algorithm i is not included as optimum compression processing.

The calculation unit 108 determines either the CPU constraint type algorithm or the NW constraint type algorithm into which each of the compression algorithms or the non-compression algorithms to be included in a combination of optimum compression processing is classified. In this exemplary embodiment, the calculation unit 108 calculates a value (a product of the degree of parallelism, the compression ratio, and the processing throughput) of "$PR_i C_i$" of the compression processing (compression algorithms or non-compression algorithms) selected as the combination of compression processing for every algorithm. The calculation unit 108 determines whether the value of the calculated "$PR_i C_i$" exceeds the network bandwidth N.

That is, when "$PR_i C_i < N$," the calculation unit 108 determines that algorithm i is the CPU constraint type algorithm. This process corresponds to step ST409 of FIG. 5.

On the other hand, when "$PR_i C_i \geq N$," the calculation unit 108 determines that algorithm i is the NW constraint type algorithm. This process corresponds to step ST407 of FIG. 5.

Hereinafter, a specific example of a process (a process corresponding to step S403 of FIG. 5) of calculating optimum compression processing by the calculation unit 108 will be described.

As the specific example, the following situation is assumed.

Parameters of compression algorithm 1 are "$C_1 = 108.98$ MB/s" and "$R_1 = 0.68$." Parameters of compression algorithm 2 are "$C_2 = 17.88$ MB/s" and "$R_1 = 0.38$." Parameters of non-compression algorithm 3 are "$C_3 = 512950$ MB/s" and "$R_3 = 1$." FIG. 7 shows these parameters. The second compression processing unit 134 of the compression processing unit 103 performs compression processing in a degree of parallelism "P=5" using five CPU cores. In the network 20, the available network bandwidth "N=110 MB/S."

Under the above-described assumption, the calculation unit 108 reads these parameters from the parameter holding unit 107 and substitutes the read parameters into Formula (1) to solve Formula (1) after the substitution using the simplex method. As a solution, a combination of the data ratios ($x_1$, $x_2$, and $x_3$) for maximizing the effective throughput E is obtained. When the data ratio of compression processing is "($x_1$, $x_2$, $x_3$)=(0.22, 0.77, 0.0)," the calculation unit 108 derives the maximum effective throughput E as 192.52 MB/s.

When this result is obtained, the calculation unit 108 selects a combination of compression processing for optimizing the effective throughput E, that is, a combination of compression processing in which the derived data ratio Xi is greater than 0, as an optimum compression processing combination. Consequently, the calculation unit 108 selects compression algorithms 1 and 2 as the optimum compression processing combination.

The calculation unit 108 derives "$PR_1 C_1 = 370.22$ MB/s" and "$PR_2 C_2 = 33.972$ MB/s" by substituting these parameters. In relation to compression algorithm 1, "$PR_1 C_1 \geq N$" is obtained from a calculation result. Thus, the calculation unit 108 determines that compression algorithm 1 is the NW constraint type compression processing technique and sets compression algorithm 1 as the NW constraint type compression processing technique. This process corresponds to step ST407 of FIG. 5.

In addition, the calculation unit 108 sets an output destination (temporary saving destination) of compressed data generated through compression algorithm 1 at the second holding unit 105. This process corresponds to step ST408 of FIG. 5.

On the other hand, in relation to compression algorithm 2, "$PR_2 C_2 < N$" is obtained from a calculation result. Thus, the calculation unit 108 determines that compression algorithm 2 is the CPU constraint type compression processing technique and sets compression algorithm 2 as the CPU constraint type compression processing technique. This process corresponds to step ST409 of FIG. 5.

In addition, the calculation unit 108 sets an output destination (temporary saving destination) of compressed data generated through compression algorithm 2 at the third holding unit 106. This process corresponds to step ST410 of FIG. 5.

For processing of data in a transfer destination, that is, processing by the analysis device 30, for example, technology disclosed in Japanese Unexamined Patent Application, First Publication No. H01-108631 (hereinafter, Patent Document A) may be used. Using this technology, the analysis device 30 determines whether received data is compressed data or uncompressed data and allocate the received data to a temporary storage unit according to a determination result. The analysis device 30 can restore only compressed data to receive data without degrading performance.

In the data system according to this exemplary embodiment, a method of discriminating the compressed data is not particularly limited. As the discrimination method, methods such as storing a type of compression in data when it is transferred, preparing a logical transfer path for every type, etc. may be applied.

Next, advantages of the data transfer device 10 according to the first exemplary embodiment of the present invention will be described.

The first advantage is as follows. The compression processing unit 103 executes compression processing while measuring compression performance, calculates a compression performance parameter for each compression processing technique, and registers the calculated compression performance parameter in the parameter holding unit 107. Thus, it is not necessary to collect a parameter for calculation of an optimum compression technique by the calculation unit 108 from test data or the like in advance. As a result, it is possible to reduce the effort necessary for setting in advance.

The second advantage is as follows. The compression processing unit 103 periodically registers a compression performance parameter. Consequently, even when the compression performance parameter of each compression processing technique has changed, it is possible to follow the change and update the compression performance parameter.

The third advantage is as follows. The compression processing unit 103 can periodically perform switching to the compression processing by the first compression processing unit 133 while executing the compression processing based on the optimum compression technique by the second compression processing unit 134. Thereby, it is possible to have an advantage of compression processing by the second compression processing unit 134 to be described below and it is possible to follow a change in a parameter by simplifying the setting of a parameter for use in calculation of the optimum compression technique.

The fourth advantage is that it is possible to use CPU resources at high efficiency in the compression processing unit 103 and improve effective throughput.

There are two reasons for this. The first reason is that the data transfer device 10 includes the first holding unit 102, the second holding unit 105, and the third holding unit 106. In this manner, because a temporary holding unit for compression processing and a temporary holding unit for a transfer are separately provided, an ineffective process in which the compression processing unit 103 acquires already compressed data does not occur.

The second reason is that the data transfer device 10 includes the second holding unit 105 and the third holding unit 106. Thereby, it is possible to separately provide a temporary holding unit for NW constraint type processing and a temporary holding unit for CPU constraint type processing and to perform transmission so that the NW bandwidth is not wasted while transmitting more data compressed at high efficiency, contributing to improvement in effective throughput occurring due to the CPU constraint type processing.

The fifth advantage is that it is possible to improve the effective throughput by using available CPU resources without waste. This is because the calculation unit 108 calculates and uses an algorithm of compression processing for optimizing the effective throughput by maximally utilizing the CPU resources using the mathematical model from a plurality of compression processing algorithms according to the available CPU resources and the NW bandwidth.

Hereinafter, the background technology of the data transfer device 10 according to this exemplary embodiment will be described.

According to the rise of parallel processing infrastructures in which high-speed analysis is possible in parallel processing, movement has become active to incorporate it for high-speed analysis of a large amount of data for trend and knowledge derivation. For example, utilization examples of Hadoop, which is well-known as a parallel processing infrastructure, includes the mining of customer information and an action history, and tendency analysis from a large amount of log information. The form in which data from a conventional system is imported to the parallel processing infrastructure and analyzed may be considered as one configuration of a system utilizing the parallel processing infrastructure. Services capable of easily constructing a parallel processing infrastructure on the cloud have recently appeared and cases in which the parallel processing infrastructure is in a remote site are also considered.

When a large amount of stored data is processed in a parallel processing infrastructure at a high speed, the speed of importing data to the parallel processing infrastructure is important. Conventionally, weekly and daily stored data is imported using an extract-transform-load (ETL) tool or an own tool.

However, there is a concern that when the data import to the parallel processing infrastructure is time-consuming due to an increase in a data amount, the entire batch process becomes time-consuming. In addition, the demand to rapidly analyze large amounts of continuously generated data is increasing. As a related technical field, there is near real-time ETL. Real-time analysis of a large amount of data is attempted by iterating online batch processing at a shorter interval from conventional daily offline batch processing.

As one cause of a bottleneck during the data import, an NW bandwidth bottleneck is considered. It is possible to implement broadband I/O through recent storage technologies (disk parallelization by a disk array, a storage based on a high-speed memory such as a flash, etc.). It occurs when this storage system is adopted and the NW bandwidth is relatively narrowed. In addition, the bottleneck is also considered to occur when the parallel processing infrastructure is in the remote site and the NW bandwidth to there is narrow.

As one of technologies for eliminating the NW bandwidth bottleneck, there is a technique of compressing transfer data and improving effective throughput.

For example, according to Patent Document 1, network transfer throughput is improved by compressing transfer data in a network adapter part. In addition, Japanese Patent Publication No. 3329390 (hereinafter, Patent Document A) proposes a data compression scheme in which a file transfer from a low-speed disk is assumed is proposed.

In addition, Japanese Unexamined Patent Application, First Publication No. H01-108631 (hereinafter, Patent Document B) proposes technology for preventing transfer processing performance from being degraded due to compression processing by providing compression and non-compression buffers and transferring data of low compression efficiency as it is.

However, in these technologies, improving the effective throughput of a transfer through compression using surplus calculation resources, for example, an empty core of a multi-core calculator, is not implemented. Here, the effective transfer throughput is defined as transfer throughput in a format of data to be transferred.

In the cases of Patent Document 1 and Patent Document A, the compression processing and the transfer processing depend upon a serial manner. Thus, the performance of the compression processing directly affects the transfer performance. Thus, it is considered the deterioration of the effective transfer throughput due to the processing performance of the compression algorithm and a performance change owing to an available calculation resource change.

Patent Document B discloses a configuration in which the compression processing and the transfer processing can be executed in parallel. However, because there is no means for controlling a degree of a compression ratio at which effective transfer throughput increases, implementation is difficult.

Figure 8:
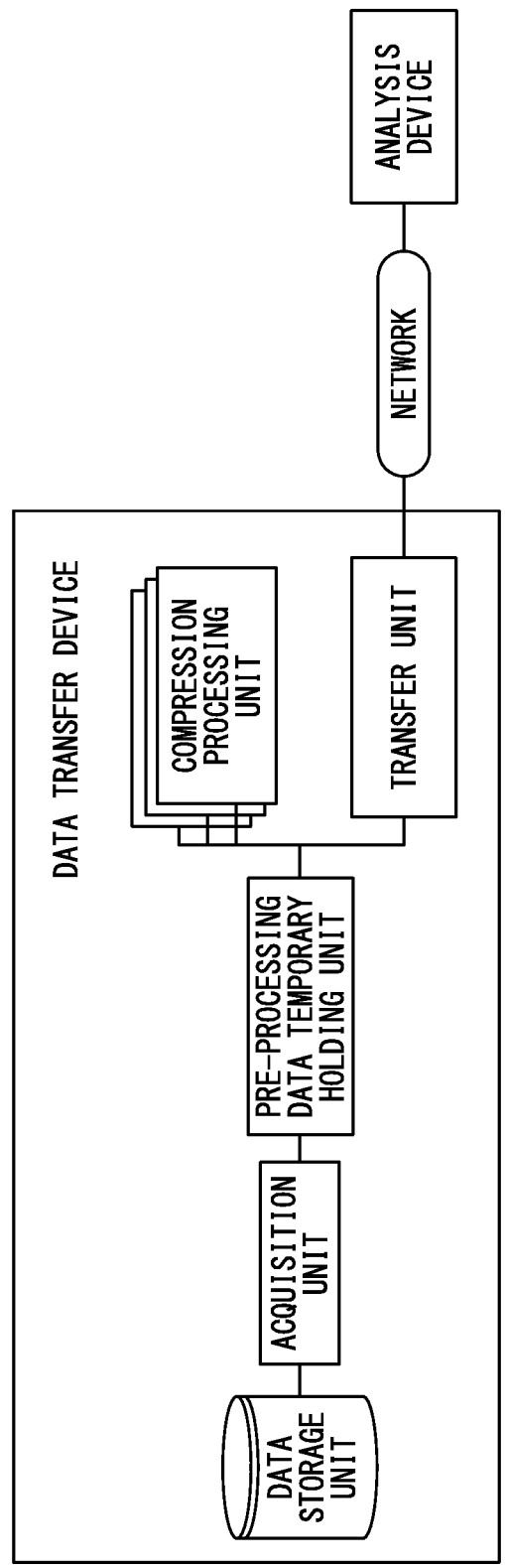
FIG. 8 is a diagram for describing background art according to the present invention.

Related Article 1 proposes a method of improving effective throughput by providing CPU-bound compression processing and I/O-bound transfer processing in parallel. The transfer processing and the compression processing involve a common buffer, data is extracted from the buffer and compressed in the compression processing, and it is returned to the buffer again. In one transfer process, compressed and uncompressed data from the buffer is mixed and transferred. In this method, effective throughput is improved by effectively using CPU and NW bandwidths. In Related Article 1, the compression processing is evaluated in only one parallel case. Because a plurality of cores are provided in many recent servers, it is easy to imagine that the effective throughput can be further improved by further increasing a degree of parallelism of compression processing (See FIG. 8).

Related Article 1 is 'CPU and L. Singaravelu, "Fine-grain adaptive compression in dynamically variable networks," in International Conference on Distributed Computing Systems, 2005, pp. 685-694'.

However, there is a problem in that it is difficult to effectively utilize CPU resources in a method of increasing a degree of parallelism of compression processing based on the configuration of Related Article 1. There are two causes of this problem.

The first cause is that the transfer processing and the compression processing share the same buffer. Two phenomena that cause inefficient CPU resource utilization occur when the buffer is shared.

The first phenomenon is that data is transmitted without compression in the transfer processing despite that there are CPU resources capable of actually performing compression because the transfer processing generally has a higher speed than the compression processing.

The second phenomenon is that compressed data is re-acquired in the compression processing and an unnecessary overhead is added.

The second cause is based on limitations of a technique using one type of compression algorithm. Related Article 1 proposes a technique under the assumption that the data throughput after compression does not exceed the NW bandwidth. However, a compression algorithm of increasing a compression processing speed at the sacrifice of the compression ratio has recently been proposed. In addition to this, when an increase in the degree of parallelism of the compression processing is desired, the data throughput after the compression processing is considered to exceed the NW bandwidth. In this state, it is no longer possible to improve the effective throughput even when the CPU resources are allocated to the compression processing and it is difficult to effectively utilize available CPU resources even when the available CPU resources are present.

In this background technology, the first problem is that it is difficult to improve the effective throughput by effectively using the CPU resources in the compression processing.

This is because two phenomena associated with inefficient use of the CPU resources occur because the compression processing and the transfer processing share processing target data in a common buffer. The first phenomenon is that data is transmitted without compression in the transfer processing despite the fact that there are CPU resources capable of actually performing compression because the transfer processing generally has a higher speed than the compression processing. The second phenomenon is that compressed data is re-acquired in the compression processing and an unnecessary overhead is added.

The second problem is that it is difficult to improve the effective throughput in spite that there are available CPU resources.

This is because the CPU resources are no longer used if the data throughput after the compression processing exceeds the NW bandwidth when one type of compression algorithm is used.

According to the data transfer device 10 according to this exemplary embodiment, it is possible to increase the degree of parallelism of the compression processing to improve the effective throughput and shorten a data transfer time. In addition, the data transfer device 10 according to this exemplary embodiment can be applied for the purpose of transferring a large amount of data at a high speed.

Second Exemplary Embodiment

Next, an example of the configuration of a data transfer device according to the second exemplary embodiment of the present invention will be described.

Figure 9:
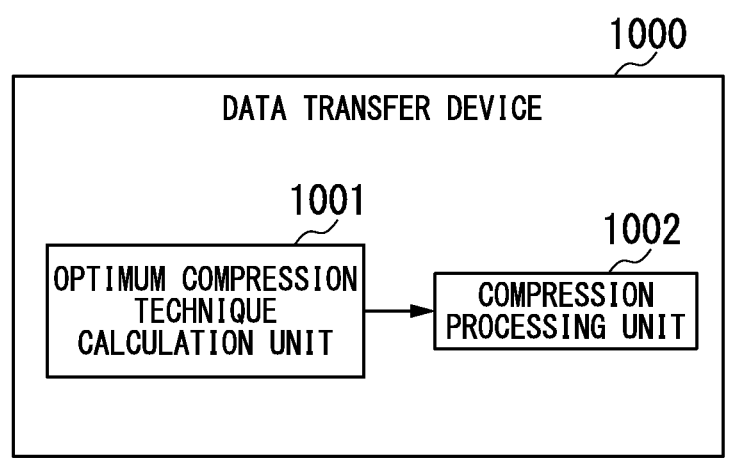
FIG. 9 is a diagram showing an example of a configuration of a data transfer device according to a second exemplary embodiment of the present invention.

FIG. 9 is a diagram showing the example of the configuration of the data transfer device according to the second exemplary embodiment of the present invention.

As shown in FIG. 9, the data transfer device 1000 according to the second exemplary embodiment of the present invention includes at least a calculation unit 1001 and a compression processing unit 1002. The calculation unit 1001 calculates an optimum compression technique for optimizing the effective throughput based on performance measurement parameters obtained through performance measurement during compression processing in which input data is compressed and during transfer processing in which compressed data compressed through the compression processing is transferred to a transfer destination.

Through the optimum compression technique calculated by the calculation unit 1001, the compression processing unit 1002 compresses target data using a combination of the CPU constraint type processing in which the processing speed of compression processing may be constrained as compared with the processing speed of transfer processing and the NW constraint type processing in which the processing speed of transfer processing may be constrained as compared with the processing speed of compression processing.

The data transfer device 10 according to this exemplary embodiment internally may have a computer system. An operation process may be stored in a computer-readable recording medium in the form of a program. The computer system may read and execute the program and the above-described process may be performed. The "computer system" used here includes a CPU, various types of memories, an OS, and hardware such as peripheral devices.

The "computer system" includes a homepage providing environment (or displaying environment) when a WWW system is used.

A process may be performed in which the program for implementing each step is recorded on the computer-readable recording medium, the program for implementing its function is recorded on the computer-readable recording medium, and the computer system is read and executed.

The "computer-readable recording medium" includes a flexible disk, a magneto-optical disc, a ROM, a writable non-volatile memory such as a flash memory, a portable medium such as a CD-ROM, and a storage apparatus such as a hard disk embedded in the computer system.

The "computer-readable recording medium" includes a medium that holds a program for a constant period of time, such as a volatile memory (e.g., dynamic random access memory (DRAM)) inside a computer system serving as a server or a client when the program is transmitted via a network such as the Internet or a communication circuit such as a telephone circuit.

The above-described program may be transmitted from a computer system storing the program in a storage apparatus or the like via a transmission medium or transmitted to another computer system by transmission waves in a transmission medium. The "transmission medium" for transmitting the program includes a medium having a function of transmitting information, such as a network (communication network) like the Internet or a communication circuit (communication line) like a telephone circuit.

In addition, the above-described program may be a program for implementing some of the above-described functions.

Further, the above-described program may be a program, i.e., a so-called differential file (differential program), capable of implementing the above-described function in combination with a program already recorded on the computer system.

In addition, in the scope without departing from the subject matter of the present invention, it is possible to appropriately replace components in the above-described exemplary embodiments with well-known components. In addition, the technical scope of the invention is not limited to the above-mentioned exemplary embodiments, and various modifications can be made within the scope that does not depart from the subject matter of the invention.

This application is based upon and claims the benefit of priority from Japanese patent application No. 2013-083786, filed Apr. 12, 2013, the disclosure of which is incorporated herein in its entirety by reference.

INDUSTRIAL APPLICABILITY

The present invention is applicable to a data transfer device, a data transfer system, a method for compressing and transferring data, and a program.

REFERENCE SYMBOLS

10 Data transfer device
20 NW
30 Analysis device (external device)
100 Data storage unit
101 Acquisition unit
102 Temporary pre-compression data holding unit (first holding unit)
103 Compression processing unit
104 Transfer processing unit
105 Temporary holding unit for NW bandwidth constraint type processing (second holding unit)
106 Temporary holding unit for CPU constraint type processing (third holding unit)
107 Performance measurement parameter holding unit (parameter storage unit)
108 Optimum compression technique calculation unit (calculation unit)
109 Timer
131 Timing determination unit
132 Compression information holding unit (information holding unit)
133 Compression performance measurement compression processing unit (first compression processing unit)
134 Optimum compression technique compression processing unit (second compression processing unit)
141 NW bandwidth measurement unit (measurement unit)
142 Transfer unit

What is claimed is:

1. A data transfer device comprising:
a calculation unit configured to determine, from a plurality of compression techniques, a combination of a first compression technique and a second compression technique for optimizing effective throughput based at least on compression performance parameters related to the plurality of compression techniques and a transfer performance parameter related to transfer processing, the first compression technique being a technique in which a speed of compression processing serves as a constraint in a data transfer as compared with a speed of transfer processing, the second compression technique being a technique in which a speed of transfer processing serves as a constraint in a data transfer as compared with a speed of compression processing;
a compression processing unit configured to compress target data using the first compression technique and the second compression technique;
a temporary holding unit configured to temporarily hold the target data compressed using the first compression technique and the target data compressed using the second compression technique; and
a transfer unit configured to preferentially transfer the target data compressed using the first compression technique in a state in which the temporary holding unit is temporarily holding both of the target data compressed using the first compression technique and the target data compressed using the second compression technique.

2. The data transfer device according to claim 1, wherein a compression ratio of the first compression technique is higher than a compression ratio of the second compression technique.

3. The data transfer device according to claim 1, wherein the compression processing unit includes a first compression processing unit configured to compress data using an execution compression technique which is one of the plurality of compression techniques, periodically acquire a compression performance parameter related to the execution compression technique, and store the acquired compression performance parameter in a parameter holding unit.

4. The data transfer device according to claim 3, wherein the first compression processing unit is further configured to measure amounts of data before and after compression using the execution compression technique, and calculate the compression performance parameter related to the execution compression technique based on the data amounts before and after the compression.

5. The data transfer device according to claim 3, wherein the first compression processing unit is configured to periodically execute all of the plurality of compression techniques, and acquire the compression performance parameter for each of the plurality of compression techniques.

6. The data transfer device according to claim 3,
wherein the compression processing unit further includes a second compression processing unit configured to compress the target data using the second compression technique when the second compression processing unit determines that an amount of the target data compressed using the second compression technique and held by the temporary holding unit is less than a threshold value, the second compression processing unit configured to compress the target data using the first compression technique when the second compression processing unit determines that the amount of the target data compressed using the second compression technique and held by the temporary holding unit is greater than or equal to the threshold value.

7. The data transfer device according to claim 6,
wherein the transfer unit is configured to read, from the temporary holding unit, the target data compressed using the first compression technique and the target data compressed using the second compression technique, and the transfer unit is configured to transfer, to a transfer destination, the target data compressed using the first compression technique and the target data compressed using the second compression technique.

8. The data transfer device according to claim 6, wherein the compression processing unit is configured to periodically perform switching between compression processing by the first compression processing unit and compression processing by the second compression processing unit.

9. The data transfer device according to claim 1, further comprising:
a measurement unit configured to periodically measure a data transfer amount per unit time during the transfer processing, and calculate the transfer performance parameter based on the data transfer amount.

10. A method for compressing and transferring data, the method comprising:
determining, from a plurality of compression techniques, a combination of a first compression technique and a second compression technique for optimizing effective throughput based at least on compression performance parameters related to the plurality of compression techniques and a transfer performance parameter related to transfer processing, the first compression technique being a technique in which a speed of compression processing serves as a constraint in a data transfer as compared with a speed of transfer processing, the second compression technique being a technique in which a speed of transfer processing serves as a constraint in a data transfer as compared with a speed of compression processing;
compressing target data using at least one of the first compression technique and the second compression technique;
temporarily holding, in a temporary holding unit, the target data compressed using the first compression technique and the target data compressed using the second compression technique; and
preferentially transferring the target data compressed using the first compression technique in a state in which the temporary holding unit is temporarily holding both of the target data compressed using the first compression technique and the target data compressed using the second compression technique.

11. A non-transitory computer-readable recording medium storing a program that causes a computer to execute:
determining, from a plurality of compression techniques, a combination of a first compression technique and a second compression technique for optimizing effective throughput based at least on compression performance parameters related to the plurality of compression techniques and a transfer performance parameter related to transfer processing, the first compression technique being a technique in which a speed of compression processing serves as a constraint in a data transfer as compared with a speed of transfer processing, the second compression technique being a technique in which a speed of transfer processing serves as a constraint in a data transfer as compared with a speed of compression processing;
compressing target data using at least one of the first compression technique and the second compression technique;
temporarily holding, in a temporary holding unit, the target data compressed using the first compression technique and the target data compressed using the second compression technique; and
preferentially transferring the target data compressed using the first compression technique in a state in which the temporary holding unit is temporarily holding both of the target data compressed using the first compression technique and the target data compressed using the second compression technique.

12. The data transfer device according to claim 1, wherein the transferring unit is configured to transfer the target data compressed using the first compression technique before the transferring unit transfers the target data compressed using the second compression technique.

13. The data transfer device according to claim 1, wherein the compression processing unit is configured to compress the target data using the first compression technique after the compression processing unit compresses the target data using the second compression technique.

14. The data transfer device according to claim 1, wherein the temporary holding unit comprises:
a first temporary holding unit configured to temporarily hold the target data compressed using the first compression technique; and
a second temporary holding unit configured to temporarily hold the target data compressed using the second compression technique.

15. The data transfer device according to claim 1,
wherein the compression processing unit is configured to compress a first part of the target data using the first compression technique and a second part of the target data using the second compression technique, the temporary holding unit is configured to temporarily hold the first part of the target data compressed using the first compression technique and the second part of the target data compressed using the second compression technique, and the transfer unit is configured to preferentially transfer the first part of the target data compressed using the first compression technique in a state in which the temporary holding unit is temporarily holding both of the first part of the target data compressed using the first compression technique and the second part of the target data compressed using the second compression technique.

* * * * *